US008159828B2

(12) United States Patent
Sun et al.

(10) Patent No.: US 8,159,828 B2
(45) Date of Patent: Apr. 17, 2012

(54) LOW PROFILE FLIP CHIP POWER MODULE AND METHOD OF MAKING

(75) Inventors: Ming Sun, Sunnyvale, CA (US); Demei Gong, Shanghai (CN)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 862 days.

(21) Appl. No.: 11/678,061

(22) Filed: Feb. 23, 2007

(65) Prior Publication Data

US 2008/0205008 A1   Aug. 28, 2008

(51) Int. Cl.
*H05K 1/18*   (2006.01)

(52) U.S. Cl. ......... 361/761; 361/766; 361/702; 361/704

(58) Field of Classification Search ............ 361/762, 361/784, 744, 745, 766
See application file for complete search history.

(56) References Cited

U.S. PATENT DOCUMENTS

| | | | | |
|---|---|---|---|---|
| 5,355,283 A * | 10/1994 | Marrs et al. | ........... | 361/760 |
| 5,450,046 A | 9/1995 | Kosugi et al. | | |
| 5,467,253 A * | 11/1995 | Heckman et al. | ........... | 361/761 |
| 5,561,323 A * | 10/1996 | Andros et al. | ........... | 257/707 |
| 5,646,828 A * | 7/1997 | Degani et al. | ........... | 361/715 |
| 5,731,227 A * | 3/1998 | Thomas | ........... | 438/125 |
| 5,796,170 A * | 8/1998 | Marcantonio | ........... | 257/786 |
| 5,814,883 A * | 9/1998 | Sawai et al. | ........... | 257/712 |
| 6,031,284 A * | 2/2000 | Song | ........... | 257/701 |
| 6,343,019 B1 * | 1/2002 | Jiang et al. | ........... | 361/761 |
| 6,350,954 B1 * | 2/2002 | Specks et al. | ........... | 174/551 |
| 6,449,168 B1 * | 9/2002 | Soderholm | ........... | 361/761 |
| 6,509,642 B1 * | 1/2003 | Cohn | ........... | 257/712 |
| 6,867,499 B1 * | 3/2005 | Tabrizi | ........... | 257/777 |
| 2006/0003492 A1 * | 1/2006 | Joshi | ........... | 438/112 |
| 2006/0255458 A1 * | 11/2006 | Dangelmaier | ........... | 257/735 |

\* cited by examiner

*Primary Examiner* — Tuan T Dinh
*Assistant Examiner* — Steven Sawyer
(74) *Attorney, Agent, or Firm* — Chein-Hwa Tsao; C H Emily LLC

(57) ABSTRACT

A power module is proposed to package an electronic system having flip chip power MOSFET devices. The power module includes a front surface cover board and a multi-layer printed circuit laminate bonded thereto. Notably, the front surface of the printed circuit laminate includes recessed pockets each having printed circuit traces atop its floor. Inside the recessed pockets are power MOSFET and other circuit components bonded to the printed circuit traces. As the circuit components are encased inside the power module, it features a low profile, an increased mechanical robustness and EMI/RFI immunity. Additionally, some circuit components can be provided with a front-side bonding layer that is also bonded to the front surface cover board to realize a double-side bonding to the interior of the power module. Methods for making the low profile power module are also described.

5 Claims, 5 Drawing Sheets

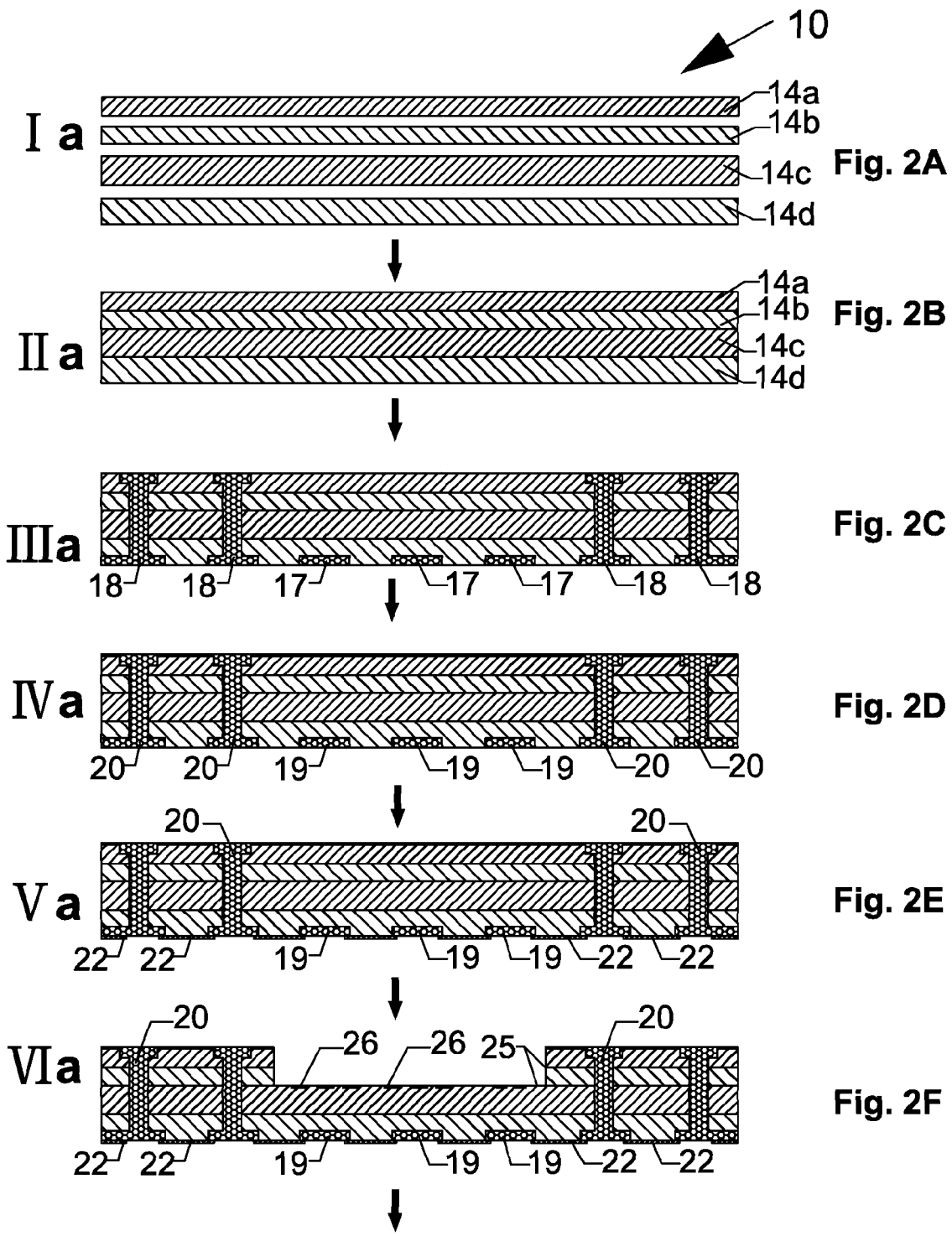

LOW PROFILE FLIP CHIP POWER MODULE AND METHOD OF MAKING

CROSS REFERENCE TO RELATED APPLICATIONS

1. Field of the Invention

This invention relates generally to the field of electronic packaging. More specifically, the present invention is directed to the packaging of power semiconductor modules.

2. Background of the Invention

A general trend of modern day electronic product, as demanded by the market place, is product miniaturization with vastly increasing functionality. With no exception, the same trend also applies to the segment of power electronics. Hence, even in the area of power electronics, there has been an ongoing need of product miniaturization concurrent with the other requirements of heat dissipation and electromagnetic interference/radio frequency interference (EMI/RFI) shielding prominent in power electronics.

SUMMARY OF THE INVENTION

A low profile power module is proposed to package an electronic system that includes power Metal-Oxide-Semiconductor Field Effect Transistor (MOSFET) devices. The power module includes an electrically conductive front surface cover board and a multi-layer printed circuit laminate physically and electrically bonded to the back of the front surface cover board. The multi-layer printed circuit laminate has numerous bonded printed circuit layers for forming a multi-layer electrical interconnection. Notably, the front surface of the printed circuit laminate includes a number of recessed pockets each having numerous printed circuit traces atop its floor. Located inside the recessed pockets are numerous flip-chip power MOSFET devices and other circuit components that are conductively bonded to the printed circuit traces atop the recessed pocket floors. As the various circuit components are encased inside the power module, it features a low profile, an increased mechanical robustness and EMI/RFI immunity.

Additionally, some of the various circuit components can be provided with a front-side bonding layer that is then conductively bonded to the front surface cover board to realize a corresponding double-side bonding to the interior of the power module. In a more specific embodiment, the power MOSFET flip chips have their source-contacts and gate-contacts located on their back-side and their drain-contacts located on their front-side as referenced to the orientation of the power module. To facilitate heat dissipation from these double-side bonded circuit components, the front surface cover board is further made heat conductive as a heat sink. As the front surface cover board is flat, an external heat sink can be easily attached to the front surface cover board so as to facilitate heat removal from the power module.

One method of making the power module includes:

A) Forming the multi-layer printed circuit laminate having the bonded printed circuit layers, the front-surface recessed pockets and the circuit components located inside and flip-chip bonded to the printed circuit traces inside recessed pockets.

B) Providing an electrically conductive front surface cover board.

C) Physically and electrically bonding the front surface of the multi-layer printed circuit laminate to the front surface cover board. As a variation, some of the circuit components can additionally be made front-side bondable hence conductively bonded to the front surface cover board in this step.

One method of forming the multi-layer printed circuit laminate further includes:

A1) Forming the numerous bonded printed circuit layers.

A2) Along the front surface of the numerous bonded printed circuit layers, creating the recessed pockets by selectively removing a corresponding number of material pockets from a corresponding number of layers of printed circuit layers.

A3) Placing the various circuit components inside the recessed pockets.

A4) Conductively bonding the various circuit components, via their back-side component bonding pads, to the recessed pockets.

An alternative method of forming the multi-layer printed circuit laminate further includes:

A1) Providing a number, according to the layer requirement of the multi-layer printed circuit laminate, of printed circuit layers.

A2) For each printed circuit layer, determining and pre-cutting out a specific number of windows each of a specific geometry such that, upon later lamination, the number of printed circuit layers would form the desired recessed pockets.

A3) Stacking and laminating the number of printed circuit layers hence simultaneously forming the desired recessed pockets.

A4) Creating, if necessary as specified by the multi-layer printed circuit laminate, additional circuit forming features such as printed through holes and solder masks on each of the now laminated printed circuit layers.

A5) Placing the various circuit components inside the recessed pockets.

A6) Conductively bonding the various circuit components, via their back-side component bonding pads, to the recessed pockets.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

FIG. 2A-FIG. 2J illustrate the steps under one embodiment to make the low profile power module under the present invention.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

Figure 1:
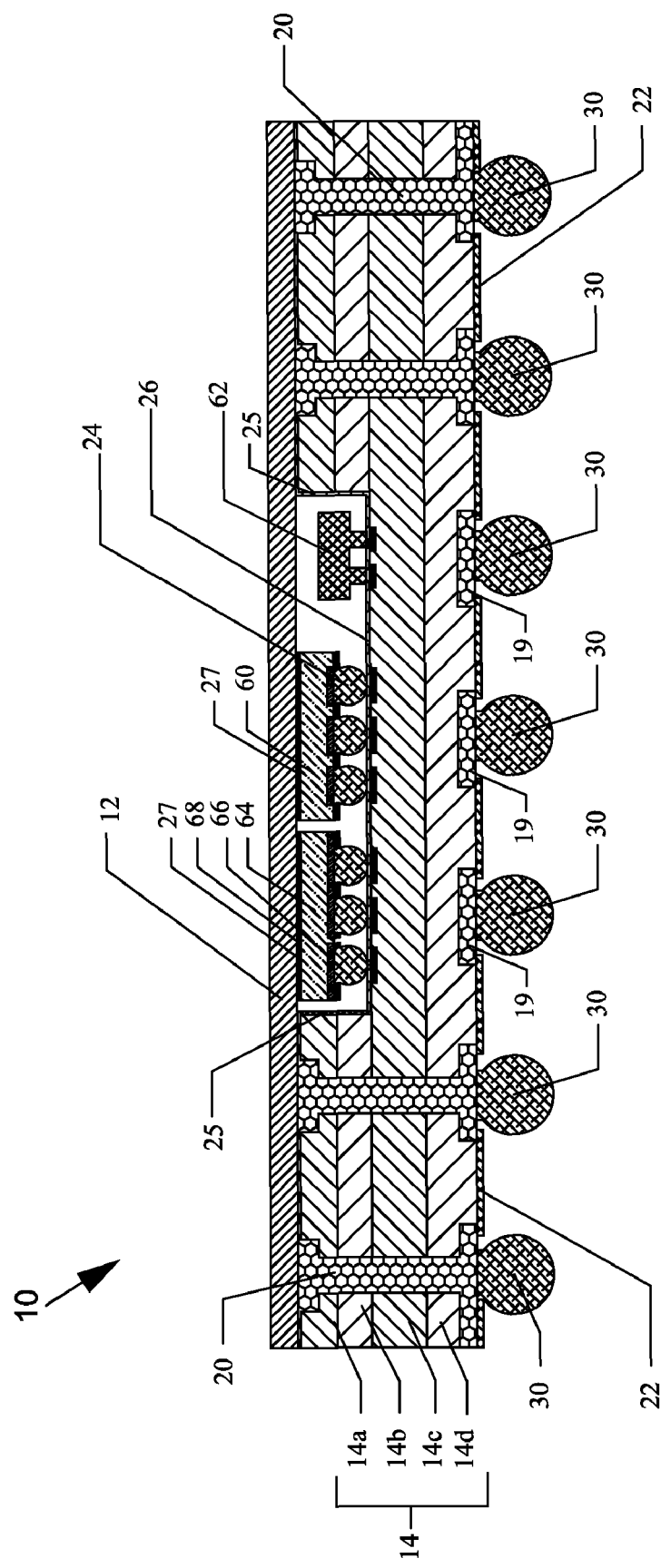
FIG. 1 is a cross sectional illustration of the low profile power module of the present invention.
Figure 2G:
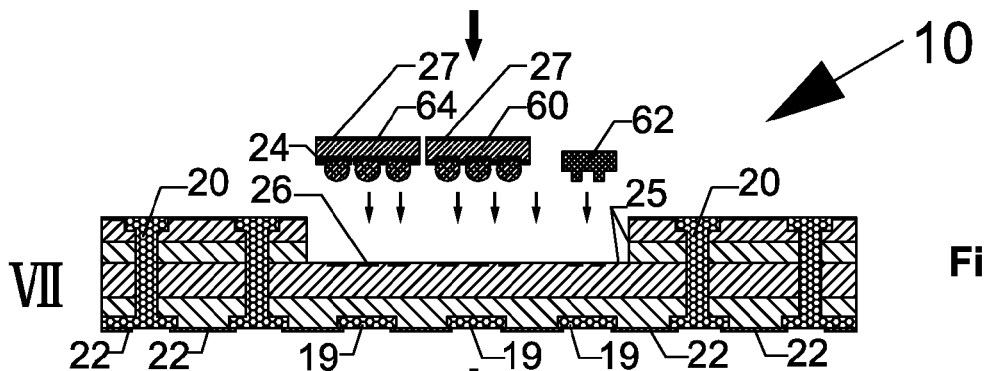
Figure 2H:
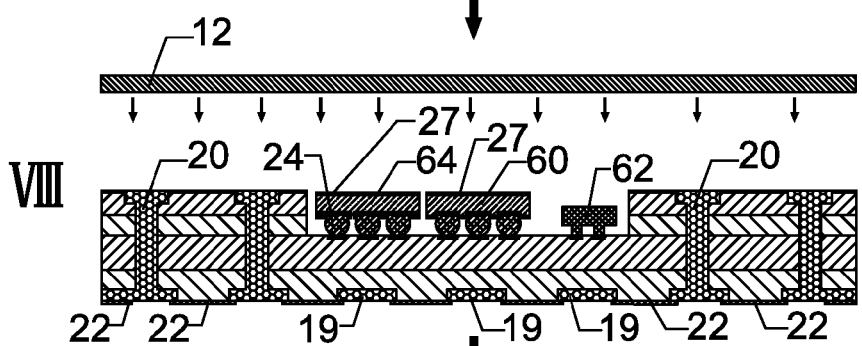
Figure 2I:
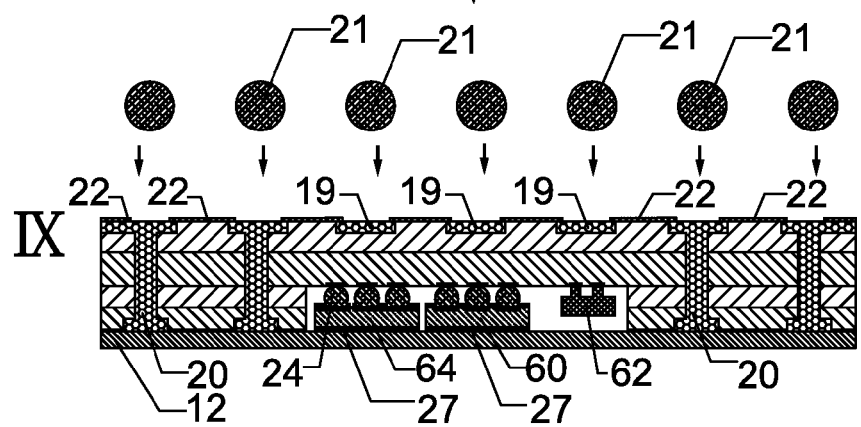
Figure 2J:
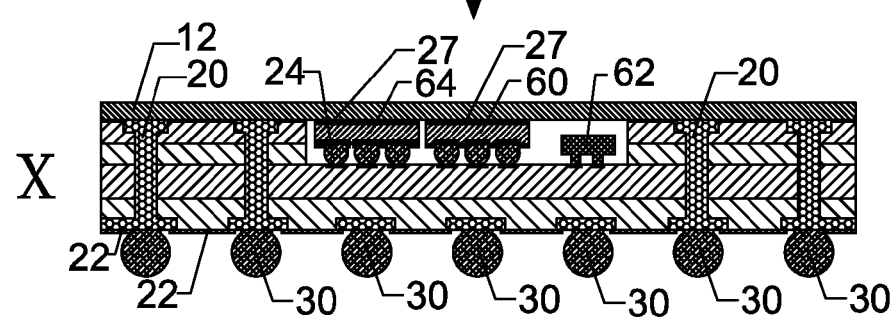
Figures 3A, 3B, 3C, 3D, 3E, 3F:
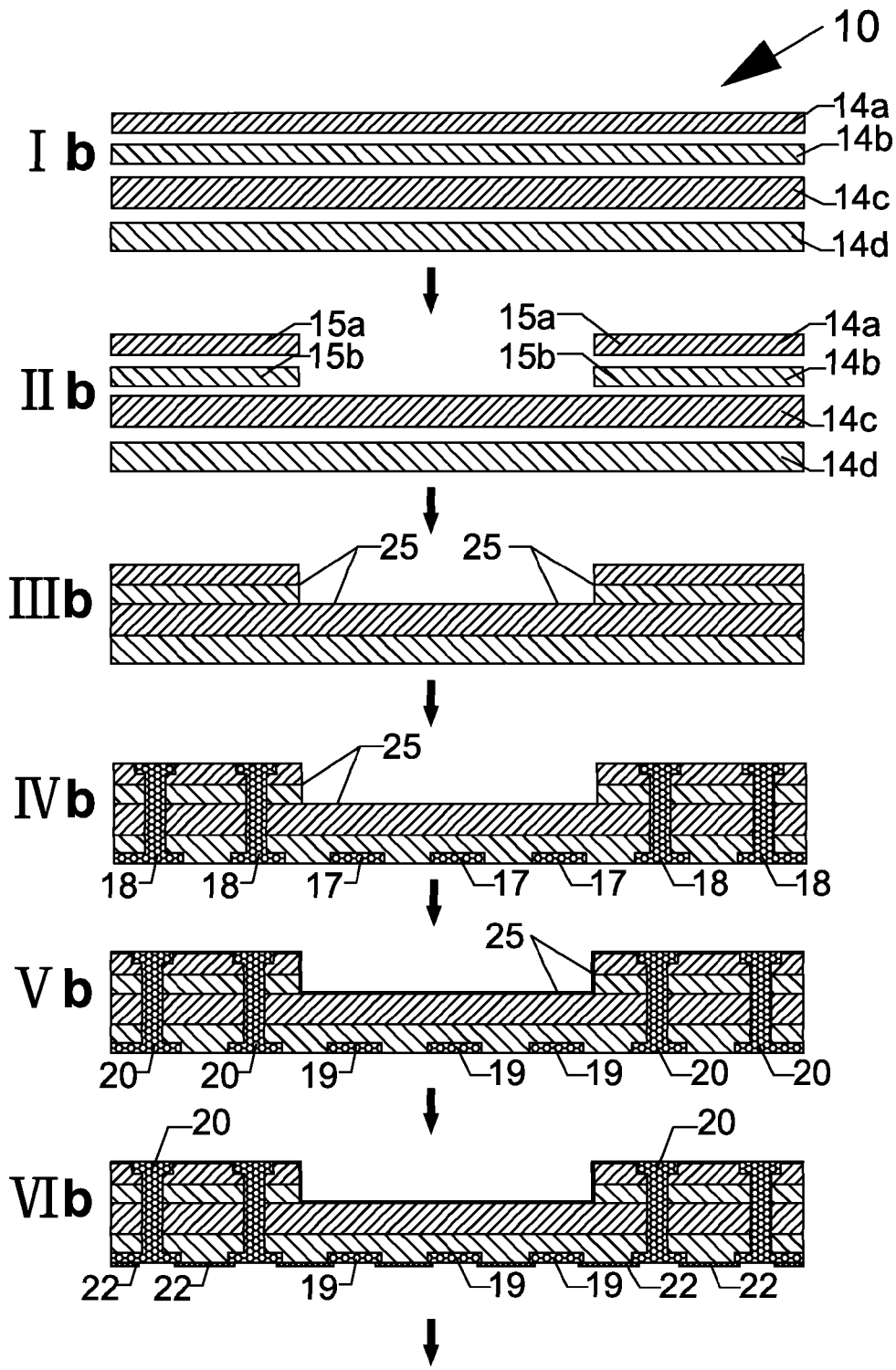
FIG. 3A-FIG. 3J illustrate the steps under an alternative embodiment to make the low profile power module under the present invention.
Figures 3G, 3H, 3I, 3J:
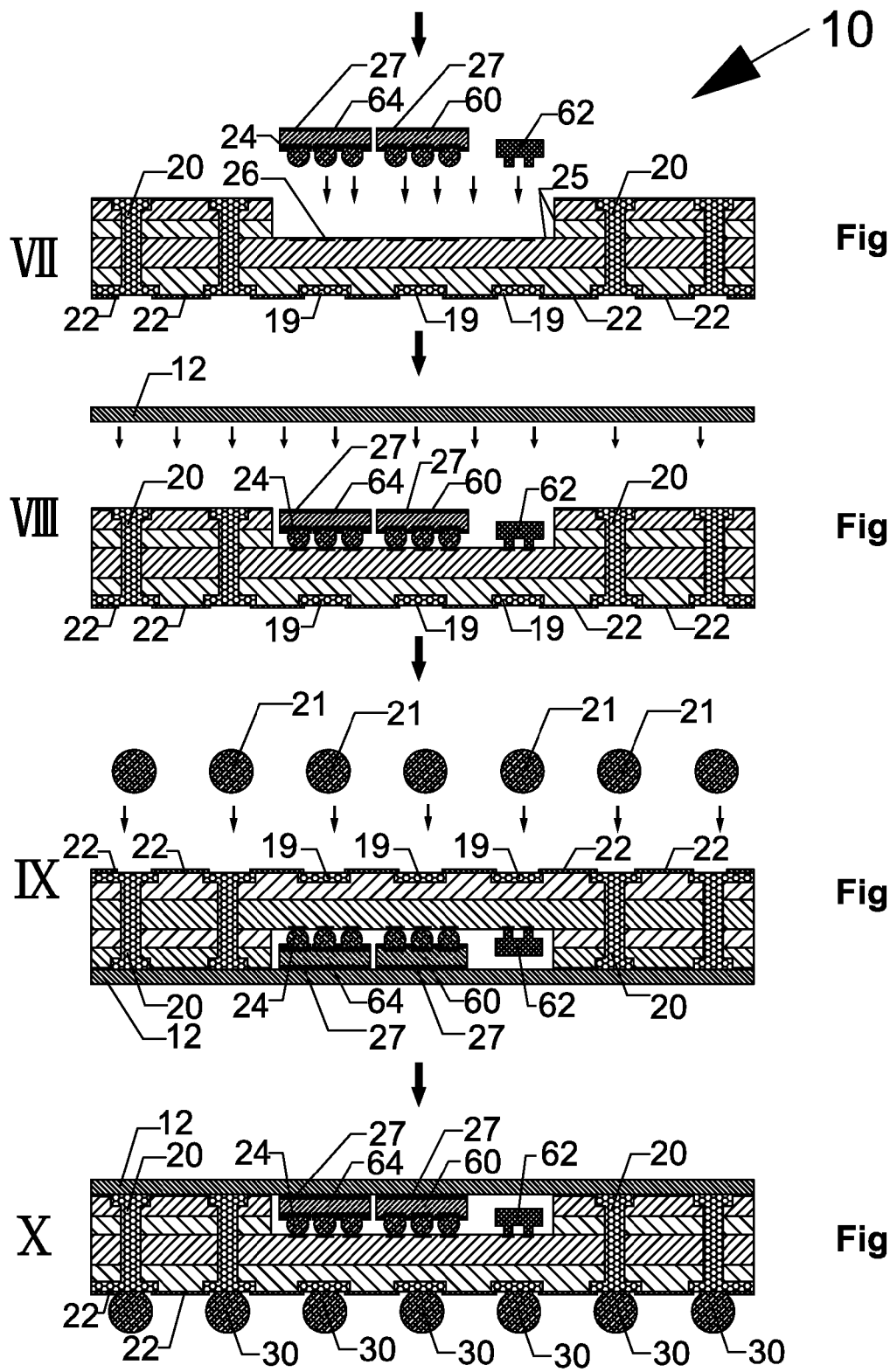

FIG. 1 is a cross sectional illustration of a low profile power module 10 of the present invention. The low profile power module 10 is proposed to package an electronic system that includes, for simplicity of illustration, one or more power Metal-Oxide-Semiconductor Field Effect Transistor (MOSFET) 64, one or more Integrated Circuit (IC) 60 and one or more passive component 62. While not specifically illustrated, the active circuitry of the power MOSFET 64 is flip-chip, with its source and gate contacts on its back side as referenced to the orientation of the low profile power module 10. Thus, the source and gate contacts of the power MOSFET 64 get electrically connected to back-side solder bumps 24 through a pad opening 66. Similarly, the packaging of the IC 60 is also of the flip chip type. It is remarked that the power MOSFET drain 68 further has a front-side component bonding layer 27, located on its front side as referenced to the orientation of the low profile power module 10.

Globally, the low profile power module 10 includes an electrically conductive front surface cover board 12 and a multi-layer printed circuit laminate 14 physically and electrically bonded to the front surface cover board 12. The multi-layer printed circuit laminate 14 has numerous laminated and bonded traditional printed circuit layers (PCB layer one 14a, PCB layer two 14b, PCB layer three 14c and PCB layer four 14d) for forming a multi-layer electrical interconnection. A few associated circuit forming constituents of the PCB layers such as plated through-hole 20 (also called "Via Hole" in the art) and solder mask 22 are illustrated. However, to avoid unnecessary obscuring details, numerous additional circuit forming constituents such as interconnecting circuit traces interposed between the PCB layers 14a, 14b, 14c and 14d are not shown here except for printed circuit traces 26 that will be presently described. As defined here, "circuit forming constituents" is a set of pre-determined three-dimensional patterns of interconnected conductive pads, printed circuit traces, planes, conductive through holes, solder masks, ball grid arrays (BGA), land grid arrays (LGA) for forming the inter-component electrical connection of an electronic system. Notably, the front surface of the multi-layer printed circuit laminate 14 includes a recessed pocket 25 having printed circuit traces 26 atop its floor. Thus, the various circuit components of power MOSFET 64, IC 60 and passive component 62, being also located atop the floor of the recessed pocket 25 at locations corresponding to the printed circuit traces 26, are electrically bonded, via the back-side solder bumps 24, to the rest of the electronic system embodied with the low profile power module 10. As power MOSFET 64 is usually a vertical device, its device current flows from one major surface of the semiconductor substrate to an opposite major surface. It is also important to point out that, with proper matching of the thicknesses amongst PCB layer one 14a, PCB layer two 14b, back-side solder bumps 24, power MOSFET 64 and front-side component bonding layer 27, the now encased power MOSFET 64, between the recessed pocket 25 and the front surface cover board 12, has its drain 68 electrically bonded to the front surface cover board 12, further connected to the back surface of the multi-layer printed circuit laminate 14 through plated through hole 20. However, wherever lateral MOSFET instead of vertical MOSFET is used, this type of double-sided conductive bonding is unnecessary so it is not necessary to electrically connect the front surface cover board 12 to the back surface of the multi-layer printed circuit laminate 14 through plated through hole 20. In such case the MOSFET 64 may still thermally contact the front surface cover board 12 to facilitate thermal dissipation. The substrate of IC 60 usually requires insulation from MOSFET drain 68 therefore is preferably not in electrical contact with front surface cover board 12. To enable further electrical connection to an external system, the low profile power module 10 includes an external ball grid array 30 metallurgically attached to a number of corresponding bonding pads 19 and plated through holes 20 located on a back surface of the multi-layer printed circuit laminate 14.

For those skilled in the art, by now it should become clear that with proper choice of size and number of recessed pocket 25 the low profile power module 10 can be embodied to encase a plurality of MOSFET, IC plus numerous other types of active and passive circuit components such as, but not limited to, BIPOLAR, IC, capacitors, inductors, resistors, diodes. As the various circuit components are encased inside the power module, it features a low profile, an increased mechanical robustness and EMI/RFI immunity. Of course, the front surface cover board 12 can be made heat conductive so as to facilitate heat dissipation from the double-side bonded power MOSFET 64 and IC 60. As the front surface cover board 12 is flat, additional external heat dissipating apparatus, such as heat sink, cooling fan, re-circulating fluid cooling module, Thermal Electric Module (TEM), can be easily attached to the front surface cover board 12 so as to facilitate heat dissipation from the double-side bonded power MOSFET 64.

As for its material, the front surface cover board 12 is an electrically conductive material such as Copper, Aluminum, Ni/Au plated other metals or laminate board, Carbon made conductive materials and ions conductive materials. The front-side component bonding layer 27 is made of an electrically conductive material such as solder paste or electrically conductive epoxy filling the gap between, for example, the front surface of power MOSFET 64 and the front surface cover board 12.

FIG. 2A-FIG. 2J illustrate the steps under one embodiment for making the low profile power module 10. In STEP Ia, the four PCB layers 14a, 14b, 14c and 14d are stacked up and registered with respect to one another. Although not specifically shown here, each of the four PCB layers 14a, 14b, 14c and 14d has been pre-formed with circuit forming constituents on it already. The four PCB layers are then, typically under heat and pressure, laminated together in STEP IIa. In STEP IIIa via holes 18 are drilled through the laminate together with partial drillings to create various pad openings 17. Next, the via holes 18 and pad openings 17 are electro-plated with a conductive material in STEP IVa to respectively become plated through holes 20 and bonding pads 19. In STEP Va solder masks 22 are printed to guard the plated through holes 20 and the bonding pads 19 against a later overflow of solder balls during their melt down to electrically bond with the plated through holes 20 and the bonding pads 19.

In STEP VIa, the recessed pocket 25 is created, along the front surface of the bonded PCB layers 14a, 14b, 14c and 14d, by selectively removing a corresponding material pocket from a corresponding number of PCB layers, in this case the PCB layer 14a. The method of removal includes mechanical milling, partial mechanical drilling and laser cutting. Notice the completion of STEP VIa reveals the printed circuit traces 26 atop PCB layer two 14b.

In STEP VII, called die attaching in the art of IC packaging, the various circuit components of power MOSFET 64, IC 60 and passive component 62 are first placed and mechanically registered inside the recessed pocket 25. Then the various circuit components are conductively bonded, via their backside solder bumps 24, to the printed circuit traces 26. As is well known in the art, a temperature above 200 degree C., depending upon the type of solder or epoxy used, is needed to form permanent die bonds.

In STEP VIII, the front surface cover board 12 is placed atop the multi-layer printed circuit laminate 14 with the various circuit components already conductively bonded to the floor of the recessed pocket 25. The front surface of the multi-layer printed circuit laminate 14, together with the front-side component bonding layer 27 of power MOSFET 64, are then physically and electrically bonded to the front surface cover board 12.

In STEP IX the partially completed low profile power module is first flipped upside down. A number of solder balls 21 are then placed upon their corresponding bonding pads 19 and plated through holes 20 of the multi-layer printed circuit laminate 14.

In STEP X the number of solder balls 21 are metallurgically bonded to their corresponding bonding pads 19 and plated through holes 20 to form the external ball grid array 30 for further electrical connection of the now completed low profile power module 10 to an external system. Notice the now completed low profile power module 10 is flipped back to its original orientation.

As a simplified overview of the present invention, the above STEPS Ia to X can be partitioned into a first portion (STEPS Ia to VII) and a second portion (VIII to X). The first portion forms the multi-layer printed circuit laminate 14 with the various circuit components of power MOSFET 64, IC 60 and passive component 62 conductively bonded to the recessed pocket 25. The second portion physically and electrically bonds the front surface of the multi-layer printed circuit laminate 14 together with the front-side of power MOSFET 64 to the electrically conductive front surface cover board 12.

FIG. 3A-FIG. 3J illustrate the steps under an alternative embodiment to make the low profile power module 10 under the present invention. Except for STEPS Ib to VIb, the rest of the STEPS VII to X are the same as were already elucidated under FIG. 2G-FIG. 2J. In STEP Ib, the four PCB layers 14*a*, 14*b*, 14*c* and 14*d* and stacked up and registered with respect to one another in the X-Y plane.

In STEP Ib, for each of the four PCB layers 14*a*, 14*b*, 14*c* and 14*d*, a specific number of windows each of a specific geometry are determined and pre-cut out with mechanical milling, partial mechanical drilling and laser cutting such that, upon later lamination, the four PCB layers would form the desired recessed pocket 25. In this case, a precut window one 15*a* is made on PCB layer one 14*a* and a precut window two 15*b* is made on PCB layer two 14*b*. Thus, in STEP IIIb, the four PCB layers 14*a*, 14*b*, 14*c* and 14*d* are laminated with the simultaneous formation of the recessed pocket 25.

In STEP IVb via holes 18 are drilled through the laminate together with partial drillings to create various pad openings 17. Next, the via holes 18 and pad openings 17 are electro-plated with a conductive material in STEP Vb to respectively become plated through holes 20 and bonding pads 19. In STEP VIb solder masks 22 are printed to guard the plated through holes 20 and the bonding pads 19 against a later overflow of solder balls during their melt down to electrically bond with the plated through holes 20 and the bonding pads 19.

While the description above contains many specificities, these specificities should not be constructed as accordingly limiting the scope of the present invention but as merely providing illustrations of numerous presently preferred embodiments of this invention. For example, other than the illustrated power MOSFET 64 and IC 60 modules, the present invention can be modified to package numerous other types of semiconductor modules or even miniature mechanical devices such as Miniature Electro Mechanical System (MEMS) devices.

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

What is claimed is:

1. A low profile power module comprising:
a front surface cover board being electrically conductive; a multi-layer printed circuit laminate, further comprising a plurality of bonded printed circuit layers each having a circuit thereon, that is physically and electrically bonded to said front surface cover board; an external ball grid array located on a back surface of the multi-layer printed circuit laminate for electrical connection to an external system; said multi-layer printed circuit laminate further comprising, along its front surface:
a) a recessed component-enclosing pocket having the circuit atop its floor;
b) a plurality of circuit components, completely enclosed inside the recessed component-enclosing pocket having a back-side component bonding area that is conductively bonded to the circuit such that the low profile power module encases said plurality of circuit components; and
c) wherein at least one of said plurality of circuit components further comprises a power MOSFET device with a drain-contact electrically bonded to said front surface cover board wherein said power MOSFET device has connections on a top and a bottom surface;
d) wherein at least one of the plurality of circuit components are flip chips with an active device area and a first part of a component bonding area located on a back-side and a second part of a component bonding area located on a front-side as referenced to the orientation of the low profile power module;
e) wherein said power MOSFET device further having the source-contact and a gate-contact located on the back-side and the drain-contact located on the front-side as referenced to the orientation of the low profile power module; and said multi-layer printed circuit laminate further comprising a plurality of plated through holes for electrically connecting a portion of the external ball grid array to the front surface cover board whereby
the low profile power module achieves an increased mechanical robustness and EMI/RFI immunity;
wherein said front surface cover board is further made heat conductive so as to facilitate heat dissipation from said at least one of the plurality of circuit components; and
comprises a heat dissipating means externally and heat conductively attached to a front surface of said front surface cover board so as to facilitate heat dissipation from said at least one of the plurality of circuit components.

2. The low profile power module of claim 1 wherein the front surface cover board is made of Copper, Aluminum, Ni/Au plated metal or laminate board, Carbon made conductive materials or ions conductive materials.

3. The low profile power module of claim 1 wherein said flip chips are IC, power MOSFET or diode.

4. A low profile power module comprising:
a multi-layer printed circuit laminate, further comprising a plurality of bonded printed circuit layers each having a circuit thereon, that is physically and electrically bonded to said front surface cover board; an external ball grid array located on a back surface of the multi-layer printed circuit laminate for electrical connection to an external system; said multi-layer printed circuit laminate further comprising, along its front surface:
a) a recessed component-enclosing pocket having the circuit atop its floor;
b) a plurality of circuit components, completely enclosed inside the recessed component-enclosing pocket having a back-side component bonding area that is conductively bonded to the circuit such that the low profile power module encases said plurality of circuit components;
c) wherein at least one of said plurality of circuit components further comprises a power MOSFET device with a drain contact electrically bonded to said front surface cover board wherein said power MOSFET device has connections on a top and a bottom; and
d) wherein said front surface cover board is further made heat conductive so as to facilitate heat dissipation from said at least one of the plurality of circuit components; said multi-layer printed circuit laminate further comprising a plurality of plated through holes for electrically connecting a portion of the external ball grid array to the front surface cover board; and a heat dissipating member externally and heat conductively attached to a front surface of said front surface cover board so as to facilitate heat dissipation from said at least one of the plurality of circuit components whereby the low profile power module achieves an increased mechanical robustness and EMI/RFI immunity; wherein at least one of the plurality of circuit components are flip chips with an active device area and a first part of the component bonding area located on the back-side and a second part of the component bonding area located on the front-side as referenced to the orientation of the low profile power module; wherein said flip chips are one of an IC, power MOSFET or diode.

5. The low profile power module of claim 4 wherein the front surface cover board is made of Copper, Aluminum, Ni/Au plated metal or laminate board, Carbon made conductive materials or ions conductive materials.

* * * * *